United States Patent
Hu et al.

(10) Patent No.: US 10,181,684 B1
(45) Date of Patent: Jan. 15, 2019

(54) POWER CONNECTOR

(71) Applicants: INVENTEC (PUDONG) TECHNOLOGY CORPORATION, Shanghai (CN); INVENTEC CORPORATION, Taipei (TW)

(72) Inventors: Hsiang-Chun Hu, Taipei (TW); Chun-Chieh Lu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/867,572

(22) Filed: Jan. 10, 2018

(30) Foreign Application Priority Data

Nov. 17, 2017 (CN) .......................... 2017 1 1142307

(51) Int. Cl.
*H01R 13/66* (2006.01)
*H01R 27/02* (2006.01)
*H03K 17/687* (2006.01)

(52) U.S. Cl.
CPC ........... *H01R 13/665* (2013.01); *H01R 27/02* (2013.01); *H03K 17/687* (2013.01)

(58) Field of Classification Search
CPC ....... H03K 17/687; H01R 27/02; H04M 1/82; G06Q 20/34
USPC .................................................... 439/620.21
See application file for complete search history.

(56) References Cited

U.S. PATENT DOCUMENTS

| | | | |
|---|---|---|---|
| 6,628,771 B1* | 9/2003 | Frise | H04M 1/82 379/207.16 |
| 2012/0229085 A1* | 9/2012 | Lau | B60L 11/1818 320/109 |
| 2013/0176401 A1* | 7/2013 | Monari | H04N 5/2252 348/47 |
| 2015/0300312 A1* | 10/2015 | Ferguson | F02P 5/15 123/406.12 |
| 2016/0066803 A1* | 3/2016 | Hu | A61B 90/11 600/561 |
| 2016/0099596 A1* | 4/2016 | Chien | H02J 7/0052 368/10 |
| 2017/0187200 A1* | 6/2017 | Somerville | H02J 7/0052 |
| 2018/0039987 A1* | 2/2018 | Molino | G06Q 20/34 |
| 2018/0249054 A1* | 8/2018 | Chien | H04N 5/2257 |

* cited by examiner

*Primary Examiner* — Jean F Duverne
(74) *Attorney, Agent, or Firm* — Maschoff Brennan (57) ABSTRACT

A power connector has a power input port, a power output port, a signal transmission port, a controller, and a bridging circuit. The power input port is configured to receive input power. The power output port is applicable for plugging into an external device so as to provide output power to the external device. The signal transmission port is applicable for plugging into the external device to receive an indication signal. The controller is electrically connected to the signal transmission port and configured to adjust a control signal based on the indication signal. The bridging circuit is respectively electrically connected to the power input port, the power output port, and the controller, and controlled by the control signal to selectively transfer part of the input power to the power output port as the output power.

9 Claims, 6 Drawing Sheets

FIG. 8B

POWER CONNECTOR

CROSS-REFERENCE TO RELATED APPLICATIONS

This non-provisional application claims priority under 35 U.S.C. § 119(a) on Patent Application No(s). 201711142307.5 filed in Chine, on Nov. 17, 2017, the entire contents of which are hereby incorporated by reference.

TECHNICAL FIELD

The disclosure relates to a power connector, and more particularly to a power connector capable of performing a cold reboot for the electronic device.

BACKGROUND

Generally, the electronic device, such as a server, a computer, etc., needs to update the firmware of certain element therein, and the updating of the firmware usually becomes effective after the electronic device is cold rebooted. In other words, the warm reboot in software updating cannot make the firmware updating of the electronic device effective. However, in certain conditions, such as the electronic device is far-off or the location of the electronic device is hard to be achieve by the operator, so the cold reboot after the firmware updating of said electronic device is hard.

SUMMARY

The invention is to provide a power connector to help the electronic device to cold reboot after the firmware updating.

In one embodiment, the power connector has a power input port, a power output port, a signal transmission port, a controller, and a bridging circuit. The power input port is configured to receive input power. The power output port is applicable for plugging into an external device so provide output power to the external device. The signal transmission port is applicable for plugging into the external device to receive an indication signal. The controller is electrically connected signal transmission port and configured to adjust a voltage of a control signal during a time period based on the indication signal. The bridging circuit is respectively electrically connected to the power input port, the power output port, and the controller, and controlled by the control signal to selectively transfer part of the input power to the power output port as the output power.

As above, the power connector in one embodiment of the invention temporarily stops supplying power to the external device while receiving the indication signal from the external device so as to perform the cold reboot which the external device needs.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
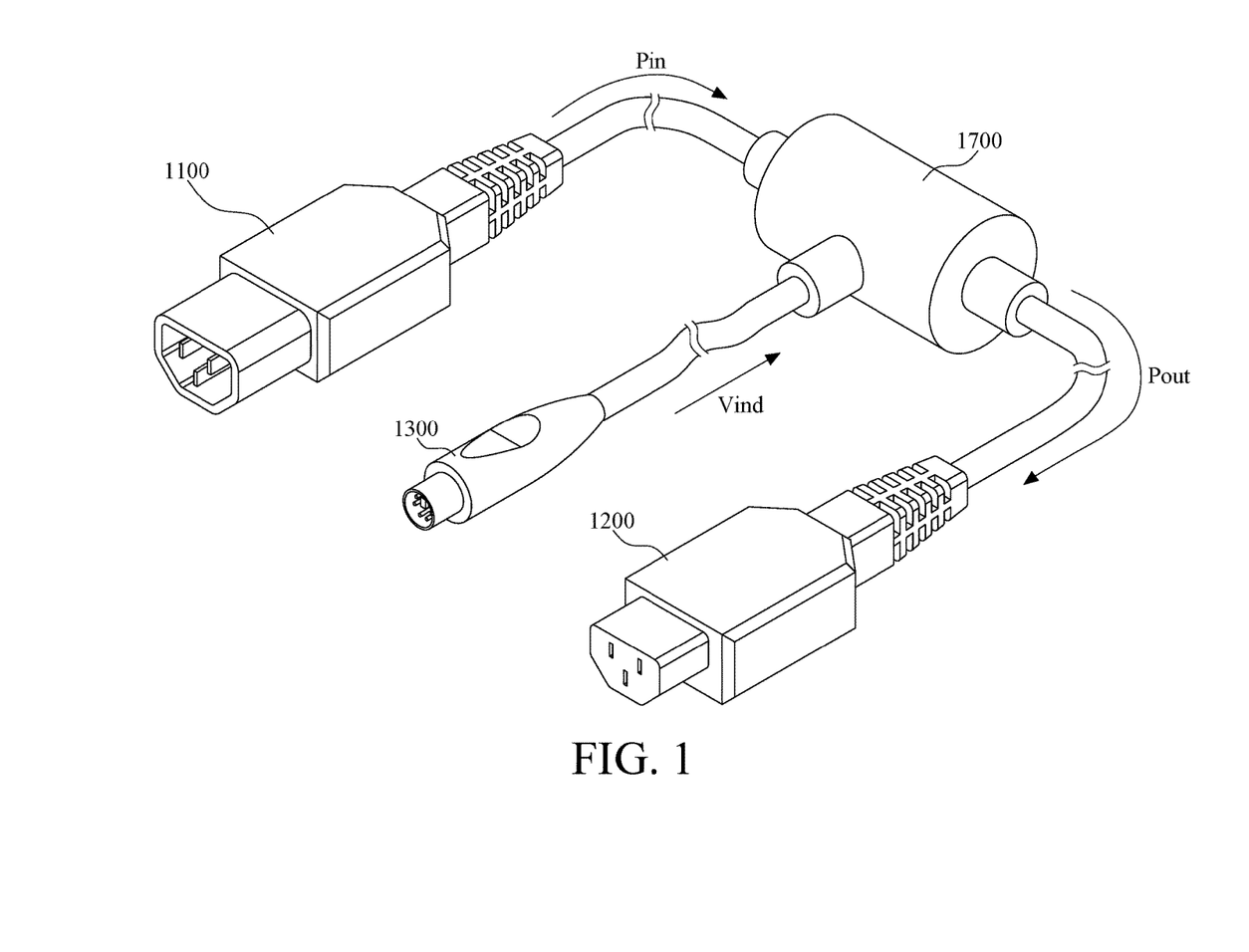
FIG. 1 is a structural schematic of a power connector in one embodiment of the invention.
Figure 2:
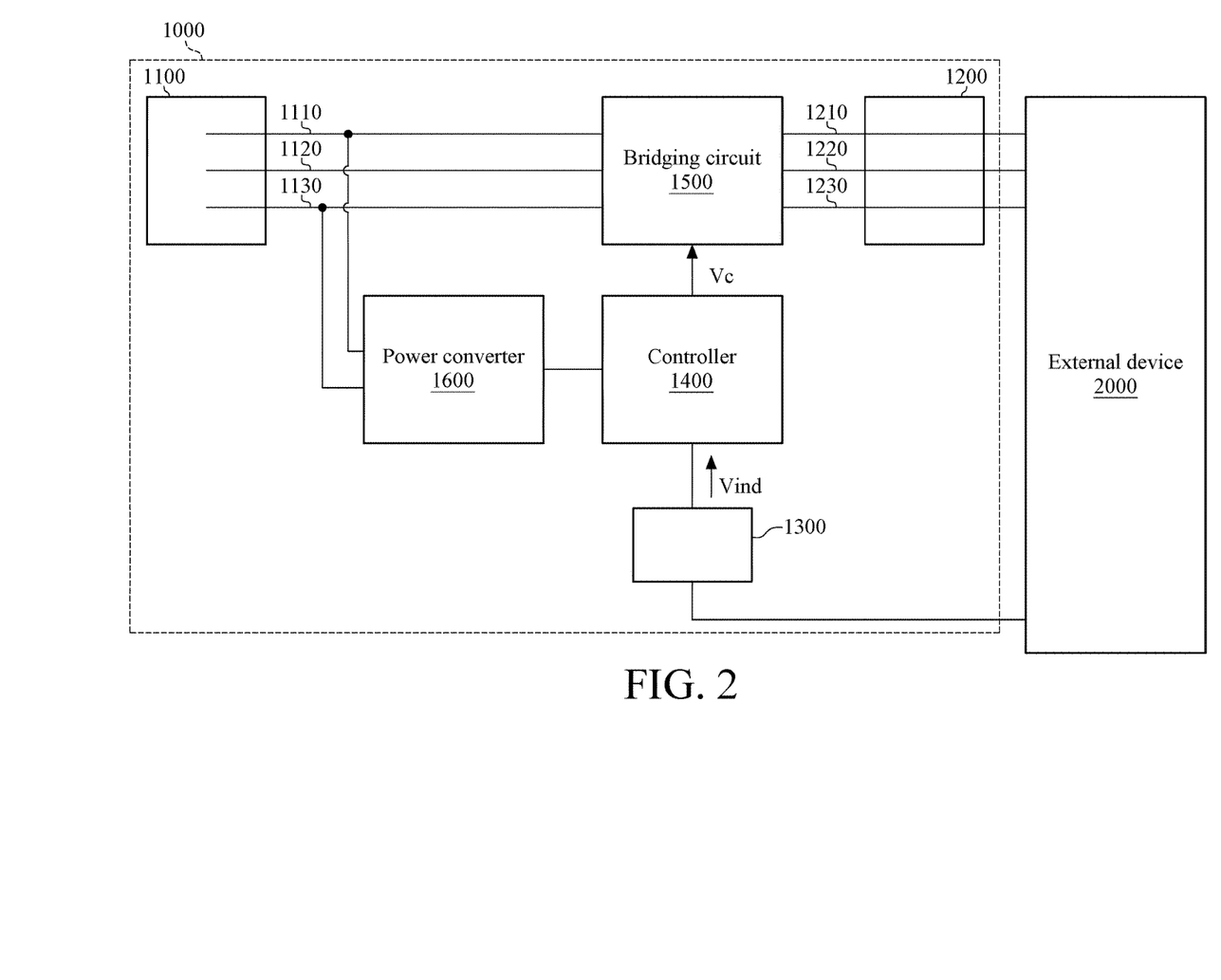
FIG. 2 is a functional block diagram of the power connector in FIG. 1.

Please refer to FIG. 1 and FIG. 2, wherein FIG. 1 is a structural schematic of a power connector in one embodiment of the invention, and FIG. 2 is a functional block diagram of the power connector in FIG. 1. As shown in FIG. 1 and FIG. 2, the power connector 1000 in one embodiment of the present invention has a power input port 1100, a power output port 1200, a signal transmission port 1300, a controller 1400, a bridging circuit 1500, and a power converter 1600. The power input port 1100 is configured to receive input power Pin. The power output port 1200 is applicable for plugging into an external device 2000 to provide output power Pout to the external device 2000. The signal transmission port 1300 is applicable for plugging into the external device 2000 to receive an indication signal Vind. In one embodiment, the controller 1400, the bridging circuit 1500 and the power converter 1600 are all in the casing 1700 of the power connector 1000.

The power converter 1600 is respectively electrically connected to the controller 1400 and the bridging circuit 1500, and configured to convert part of the input power Pin into DC power to supply the controller 1400 and the bridging circuit 1500. Explicitly, the power converter 1600 is, for example, the AC-DC converter for converting part of the AC input power Pin into DC power.

The controller 1400 is electrically connected to the signal transmission port 1300 and configured to adjust the voltage of a control signal during a time period based on the indication signal Vind. The bridging circuit 1500 is respectively electrically connected to the power input port 1100, the power output port 1200, and the controller 1400, and is controlled by the control signal to selectively transferring part of the input power Pin to the power output port 1200 as the output power Pout.

Figure 3:
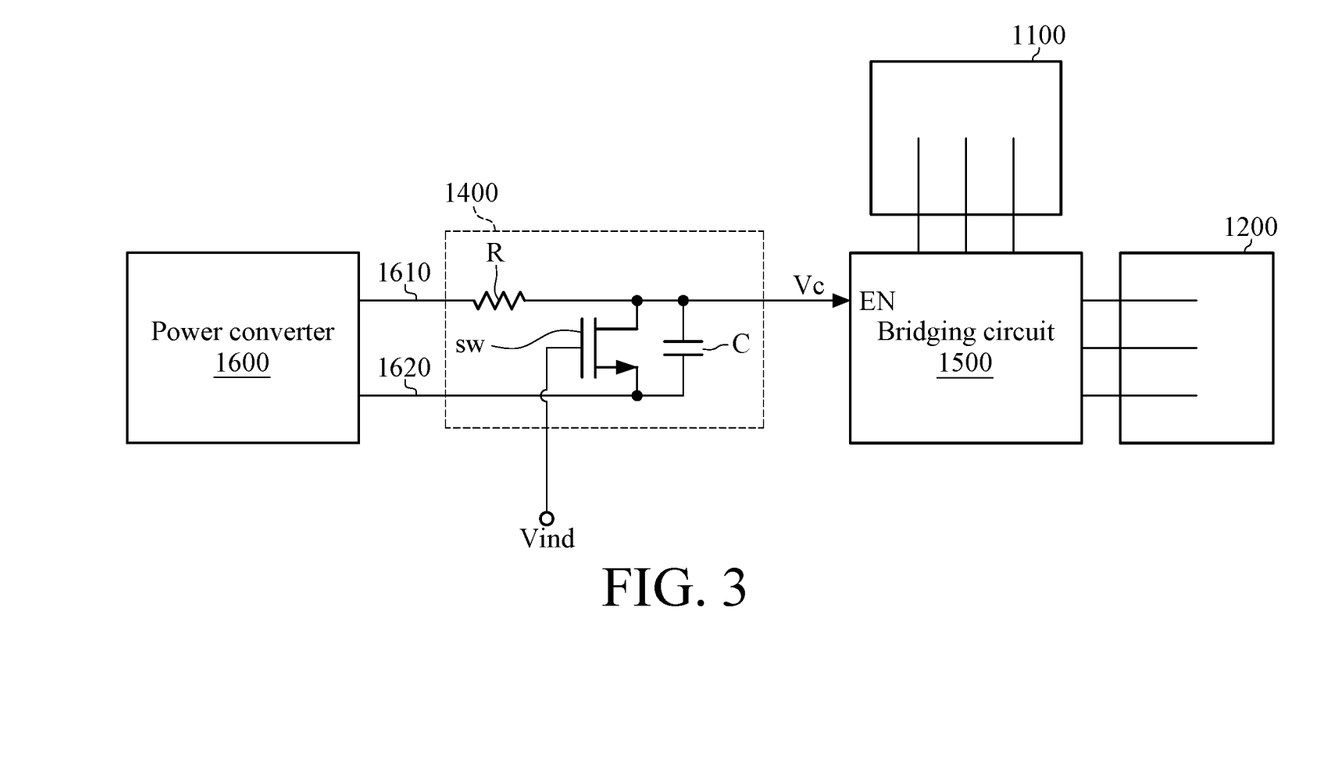
FIG. 3 is a schematic illustrating the operation of the circuit of the controller in one embodiment of the invention.

In one embodiment, please refer to FIG. 3, which is a schematic illustrating the operation of the circuit of the controller in one embodiment of the invention. As shown in FIG. 3, the power converter 1600 has a high voltage terminal 1610 and a low voltage terminal 1620. The voltage at the high voltage terminal 1610 is defined as high voltage VDD, and the voltage at the low voltage terminal 1620 is defined as the grounding voltage GND. The controller 1400 has a resistor R, a capacitor C and a switch SW. The resistor R is respectively electrically connected to the high voltage terminal 1610 of the power converter 1600 and the enable terminal EN of the bridging circuit 1500. The capacitor C is respectively electrically connected to the enable terminal EN of the bridging circuit 1500 and the low voltage terminal 1620 of the power converter 1600. The switch SW, such as an N-type metal oxide semiconductor field effect transistor (NMOSFET), is electrically connected to the capacitor C in parallel and controlled by the indication signal Vind to be selectively conducted. Herein, the signal outputted from the controller 1400 to the enable terminal EN is the control signal Vc.

Figure 4:
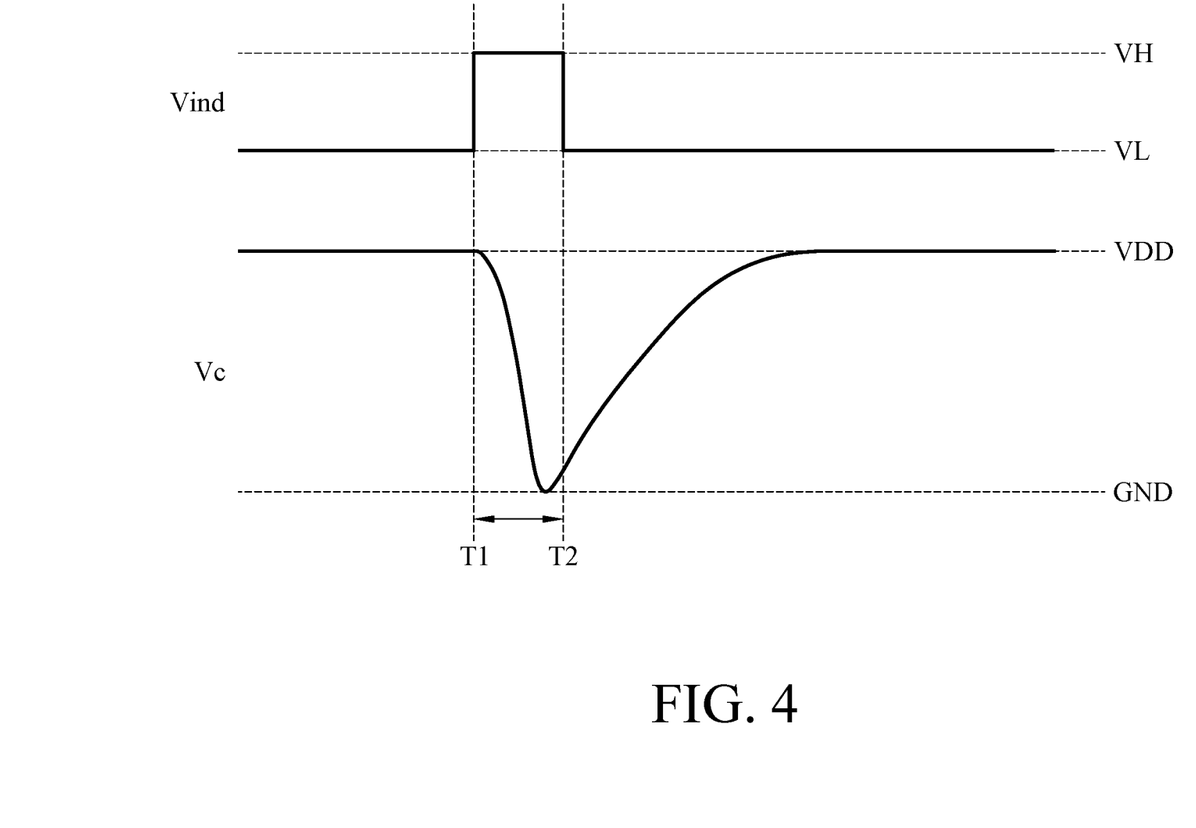
FIG. 4 is a signal timing diagram corresponding to FIG. 3.

For understanding the operation in this architecture, please refer to FIG. 3 and FIG. 4 together, wherein FIG. 4 is a signal timing diagram corresponding to FIG. 3. As shown in FIG. 4, the indication signal Vind sent from the signal transmission port 1300 is, at first, at low voltage VL, and the control signal Vc is, at first, at high voltage VDD. Hence, the bridging circuit 1500 transfers part of the input power Pin to the power output port 1200 as the output power Pout to supply to the external device 2000. When the baseboard management controller (BMC) of the external device 2000 or the basic input output system (BIOS) of the external device 2000 has its firmware updated, the voltage of the indication signal Vind sent by the external device 2000 to the controller 1400 via the signal transmission port 1300 varies from the voltage VL to the high voltage VH at the first time point T1, so the switch SW is conducted to make the control signal Vc vary from the high voltage VDD to the grounding voltage GND so that the bridging circuit 1500 stops transferring the input power Pin to the power output port 1200 and the external device 2000 is powered off. Because the external device 2000 is powered off, the indication signal Vind varies from the high voltage VH to the low voltage VL and the switch SW is no longer conducted, so the capacitor C is charged by the high voltage terminal 1610 of the power converter 1600 via the resistor R and the voltage of the control signal Vc rises. Then, at the second time point T2, the voltage of the control signal Vc is high enough to enable the bridging circuit 1500 via the enable terminal EN, so the bridging circuit 1500, again, transfers part of the input power Pin to the power output port 1200 as the output power Pout to supply to the external device 2000. Hence, the external device 2000 is cold rebooted.

In one embodiment, the controller 1400 further has a logic circuitry (not shown). After the control signal Vc is set to high voltage VDD, the logic circuitry sends a booting signal to the external device 2000 via the signal transmission port 1300 to make the external device 2000 reboot.

Figure 5:
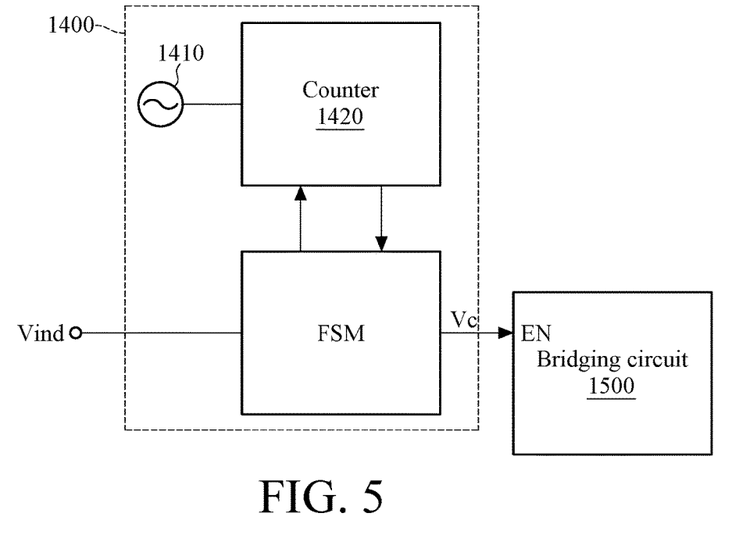
FIG. 5 is a schematic illustrating the operation of the controller in another embodiment of the invention.

In another embodiment, please refer to FIG. 5, which is a schematic illustrating the operation of the controller in another embodiment of the invention. As shown in FIG. 5, the controller 1400 has a clock generator 1410, a counter 1420 and a finite state machine FSM. The clock generator 1410 is, for example, a clock generator having a 555 oscillator or a quartz oscillator therein to output the clock signal CLK. The counter 1420 and the finite state machine FSM are both implemented with integrated circuits. The counter 1420 is electrically connected to the clock generator 1410, and the finite state machine FSM is electrically connected to the counter 1420. The finite state machine FSM receives the indication signal Vind to output the control signal Vc to the bridging circuit 1500.

Figure 6:
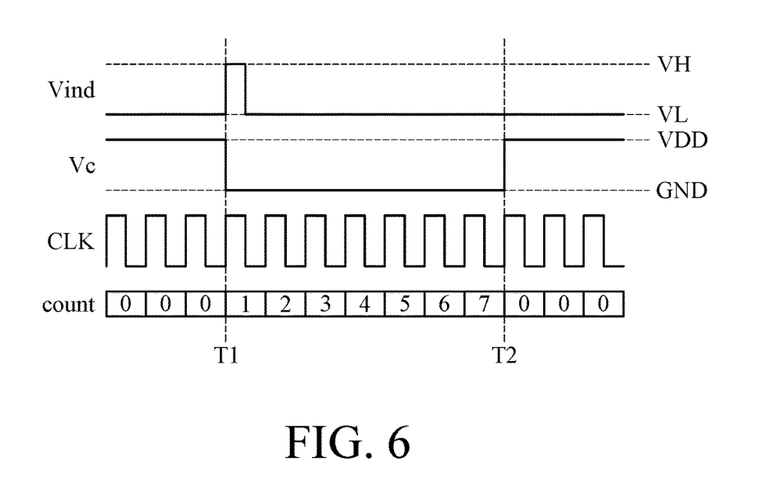
FIG. 6 is a signal timing diagram corresponding to FIG. 5.

For understanding the operation of the architecture, please refer to FIG. 5 and FIG. 6, which is a signal timing diagram corresponding to FIG. 5. As shown in FIG. 6, the voltage of the indication signal Vind sent from the signal transmission port 1300 is, at first, at low voltage VL, and the control signal Vc is, at first, at high voltage VDD, so the bridging circuit 1500 transfers part of the input power Pin to the power output port 1200 as the output power Pout to supply to the external device 2000, and the finite state machine FSM is in the first state. After the BMC of the external device 2000 or the BIOS of the external device 2000 has its firmware updated, the indication signal Vind sent from external device 2000 to the controller 1400 via the signal transmission port 1300 varies from the low voltage VL to the high voltage VH at the first time point T1, and the finite state machine FSM switches from the first state to the second state, so the control signal Vc varies from the high voltage VDD to the grounding voltage GND, and the bridging circuit 1500 stops transferring the input power Pin to the power output port 1200. Hence, the external device 2000 is powered off. Because the external device 2000 is powered off, the indication signal Vind varies from the high voltage VH to the low voltage VL. When the finite state machine FSM switches to the second, the counter 1420 counts to accumulate the counted value based on the clock signal CLK. At the second time point T2, the counted value reaches the threshold, such as 7. Hence, the counter 1420 resets the counted value and makes the finite state machine FSM to switch from the second state to the first state so that the control signal Vc is set to the high voltage VDD to enable the bridging circuit 1500 via the enable terminal EN. Hence, the bridging circuit 1500, again, transfers part of the input power Pin to the power output port 1200 as the output power Pout to supply to the external device 2000. Hence, the external device 2000 is cold rebooted.

Figure 7A:
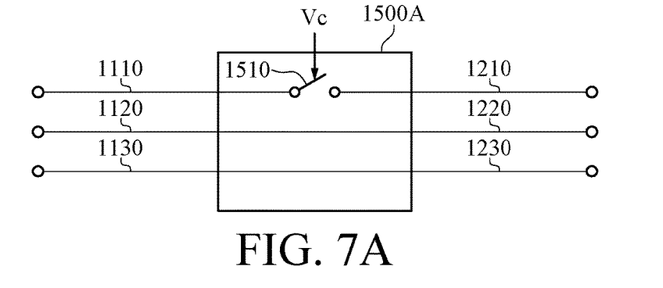
FIG. 7A is a schematic of the bridging circuit in one embodiment of the invention.

The bridging circuit 1500 is respectively electrically connected to the power input port 1100, the power output port 1200 and the controller 1400, and controlled by the control signal to selectively transfer part of the input power Pin to the power output port 1200 as the output power Pout. In one embodiment, please refer to FIG. 1 and FIG. 7A, which is a schematic of the bridging circuit in one embodiment of the invention. As shown in FIG. 1 and FIG. 7A, the power input port 1100 is, for example, a three-pin plug having an input live wire 1110, an input neutral wire 1130 and an input grounding wire 1120, and the power output port 1200 is, for example, a three-pin socket having an output live wire 1210, an output neutral wire 1230 and an output grounding wire 1220. In this embodiment, the bridging circuit 1500A connects the input grounding wire 1120 to the output grounding wire 1220, and connects the input neutral wire 1130 to the output neutral wire 1230. The bridging circuit 1500A has a first relay 1510 respectively electrically connected to the input live wire 1110 and the output live wire 1210. When the control signal Vc is at high voltage VDD, the bridging circuit 1500A is enabled and the first relay 1510 is conducted. When the control signal Vc is at low voltage GND, the bridging circuit 1500A is disabled and the first relay 1510 is not conducted.

In some embodiments, the input live wire 1110 is connected to the output live wire 1210 in the bridging circuit 1500. The first relay 1510 is not configured to selectively conduct the current path between the input live wire 1110 and the output live wire 1210, but to selectively conduct a current path between the input neutral wire 1130 and the output neutral wire 1230.

Figure 7B:
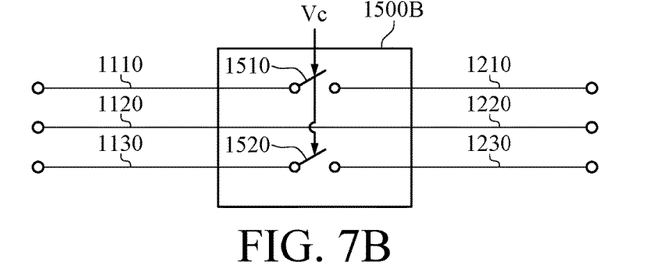
FIG. 7B is a schematic of the bridging circuit in another embodiment of the invention.

In another embodiment, please refer to FIG. 1 and FIG. 7B, which is a schematic of the bridging circuit in another embodiment of the invention. In this embodiment, the bridging circuit 1500B connects the input grounding wire 1120 to the output grounding wire 1220, the bridging circuit 1500B has a first relay 1510 and a second relay 1520. The first relay 1510 is respectively electrically connected to the input live wire 1110 and the output live wire 1210, and the second relay 1520 is respectively electrically connected to the input neutral wire 1130 and the output neutral wire 1230. When the control signal Vc is at high voltage VDD, the bridging circuit 1500B is enabled to make both of the first relay 1510 and the second relay 1520 conducted. When the control signal Vc is at low voltage GND, the bridging circuit 1500B is disabled, and both of the first relay 1510 and the second relay 1520 are not conducted.

Figure 8A:
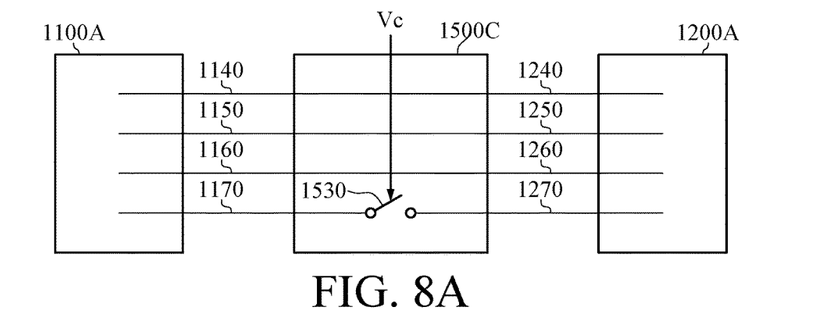
FIG. 8A is a schematic of the bridging circuit in one embodiment of the invention.

In one embodiment, please refer to FIG. 8A, which is a schematic of the bridging circuit in one embodiment of the invention. As shown in FIG. 8A, the power input port 1100A is, for example, a tri-phase plug having a first input live wire 1140, a second input live wire 1150, a third input live wire 1160 and an input neutral wire 1170, and the power output port 1200A is, for example, a tri-phase socket having a first output live wire 1240, a second output live wire 1250, a third output live wire 1260 and an output neutral wire 1270. The bridging circuit 1500C connects the first input live wire 1140, the second input live wire 1150, and the third input live wire 1160 to the first output live wire 1240, the second output live wire 1250, and the third output live wire 1260, one-to-one respectively. The bridging circuit 1500C has a first relay 1530 respectively electrically connected to the input neutral wire 1170 and the output neutral wire 1270. When the control signal Vc is at high voltage VDD, the bridging circuit 1500C is enabled and the first relay 1530 is conducted. When the control signal Vc is at low voltage GND, the bridging circuit 1500C is disabled and the first relay 1530 is not conducted.

Figure 8B:
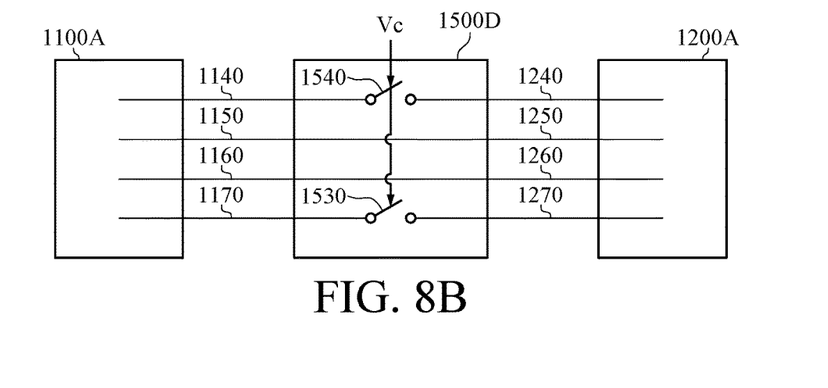
FIG. 8B is a schematic of the bridging circuit in one embodiment of the invention.

In another embodiment, please refer to FIG. 8B, which is a schematic of the bridging circuit in one embodiment of the invention. As shown in FIG. 8B, in the bridging circuit 1500D in this embodiment, the second input live wire 1150 and the third input live wire 1160 are respectively connected to the second output live wire 1250 and the third output live wire 1260. The bridging circuit 1500D has a first relay 1530 and a second relay 1540. The first relay 1530 is respectively electrically connected to the input neutral wire 1170 and the output neutral wire 1270, and the second relay 1540 is respectively electrically connected to the first input live wire 1140 and the first output live wire 1240. When the control signal Vc is at high voltage VDD, the bridging circuit 1500D is enabled and both of the first relay 1530 and the second relay 1540 are conducted. When the control signal Vc is at low voltage GND, the bridging circuit 1500D is disabled, and neither the first relay 1530 nor the second relay 1540 is conducted. The relays in the bridging circuit in aforementioned embodiments are relays capable of being used in high voltage, at least 220 volt, environment.

As above, the power connector in one embodiment of the invention temporarily stops supplying power to the external device while receiving the indication signal from the external device so as to perform the cold reboot which the external device needs.

What is claimed is:

1. A power connector, comprising:
   a power input port configured to receive an input power;
   a power output port applicable for plugging into an external device to provide an output power to the external device;
   a signal transmission port applicable for plugging into the external device to receive an indication signal;
   a controller electrically connected to the signal transmission port and configured to adjust a voltage of a control signal during a time period based on the indication signal; and
   a bridging circuit respectively electrically connected to the power input port, the power output port and the controller; wherein the bridging circuit is controlled by the control signal to selectively transfer part of the input power to the power output port as the output power.

2. The power connector in claim 1, further comprising a power converter respectively electrically connected to the controller and the bridging circuit, and configured to convert part of the input power into DC power to supply to the controller and the bridging circuit.

3. The power connector in claim 1, wherein the power input port comprises an input live wire, an input neutral wire, and an input grounding wire, and the power output port comprises an output live wire, an output neutral wire, and an output grounding wire, and the bridging circuit comprises:
   a first relay respectively electrically connected to the input live wire and the output live wire, and controlled by the control signal to be selectively conducted.

4. The power connector in claim 3, wherein the bridging circuit further comprises a second relay respectively electrically connected to the input neutral wire and the output neutral wire, and controlled by the control signal to be selectively conducted.

5. The power connector in claim 1, wherein the power input port comprises an input live wire, an input neutral wire and an input grounding wire, and the power output port comprises an output live wire, an output neutral wire and an output grounding wire, and the bridging circuit comprises:
   a first relay respectively electrically connected to the neutral wire and the output neutral wire, and controlled by the control signal to be selectively conducted.

6. The power connector in claim 1, wherein the power input port comprises a first input live wire, a second input live wire, a third input live wire and an input neutral wire, and the power output port comprises a first output live wire, a second output live wire, a third output live wire and an output neutral wire, and the bridging circuit comprises:
   a first relay respectively electrically connected to the input neutral wire and the output neutral wire, and controlled by the control signal to be selectively conducted.

7. The power connector in claim 6, wherein the bridging circuit further comprises a second relay respectively electrically connected to the first input live wire and the first output live wire, and controlled by the control signal to be selectively conducted.

8. The power connector in claim 1, further comprising a power converter electrically connected to the controller and configured to convert part of the input power into DC power to supply to the controller, wherein the controller comprises:
   a resistor respectively electrically connected to a high voltage terminal of the power converter and an enable terminal of the bridging circuit;
   a capacitor respectively electrically connected to the enable terminal of the bridging circuit and a low voltage terminal of the power converter; and
   a switch connected to the capacitor in parallel and controlled by the indication signal to be selectively conducted.

9. The power connector in claim 1, further comprises a power converter electrically connected to the controller, and configured to convert part of the input power into DC power to supply to the controller, wherein the controller comprises:

a finite state machine switched from a first state into a second state based on the indication signal, and the finite state machine adjusts the control signal to allow the bridging circuit to transfer the input power to the output port as the output power in the first state, and the finite state machine adjusts the control signal to prevent the bridging circuit from transferring the input power to the power output port as the output power;

a clock generator configured to operate with the DC power to generate a clock signal; and a counter electrically connected to the finite state machine and the clock generator, configured to count based on the clock signal if the finite state machine is in the second state, and if a counted value reaches a threshold, the counter controls the finite state machine to switch to the first state and reset the counted value.

\* \* \* \* \*